(12) United States Patent
LaFontaine

(10) Patent No.: US 6,977,718 B1
(45) Date of Patent: Dec. 20, 2005

(54) LITHOGRAPHY METHOD AND SYSTEM WITH ADJUSTABLE REFLECTOR

(75) Inventor: Bruno M. LaFontaine, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 45 days.

(21) Appl. No.: 10/791,263

(22) Filed: Mar. 2, 2004

(51) Int. Cl.[7] .............................................. G03B 27/42
(52) U.S. Cl. .............................. 355/67; 355/53; 355/71
(58) Field of Search .............................. 355/53, 67–71, 355/77; 430/5, 30, 311; 250/548, 492.1, 250/492.2; 359/859–862, 366

(56) References Cited

U.S. PATENT DOCUMENTS

| | | | |
|---|---|---|---|
| 6,195,201 B1 | 2/2001 | Koch et al. .................... | 355/67 |
| 6,243,126 B1 * | 6/2001 | Ueno .......................... | 347/248 |
| 6,379,867 B1 * | 4/2002 | Mei et al. ..................... | 355/53 |
| 6,509,955 B2 * | 1/2003 | Mei et al. ..................... | 355/53 |
| 6,870,554 B2 * | 3/2005 | Jain ............................. | 355/67 |
| 2003/0035091 A1 * | 2/2003 | Kohno ......................... | 355/67 |
| 2004/0084632 A1 * | 5/2004 | Komatsuda ............... | 250/492.2 |
| 2004/0239909 A1 * | 12/2004 | Bleeker et al. ............... | 355/67 |
| 2005/0041229 A1 * | 2/2005 | Meisburger ................. | 355/53 |

* cited by examiner

Primary Examiner—D. Rutledge
(74) Attorney, Agent, or Firm—Renner, Otto, Boisselle & Sklar, LLP

(57) ABSTRACT

A method of reflective lithography includes placing an adjustable (configurable) multi-faceted mirror in a condenser that collects and redirects light from a source to a reticle, an imaging system, and finally a target to be patterned. The adjustable multi-faceted mirror has a plurality of separately adjustable mirror elements or facets. The orientation of the mirror elements may be adjusted to adjust the characteristics of the light reaching a reflective reticle in order to achieve certain imaging characteristics at the resist layer that is being exposed. For example, coherence, shape of the illumination at the pupil of the imaging system, and/or configuration of the light output may be changed. The method and a corresponding system may be employed in extreme ultraviolet light (EUVL) lithography.

20 Claims, 4 Drawing Sheets

LITHOGRAPHY METHOD AND SYSTEM WITH ADJUSTABLE REFLECTOR

BACKGROUND OF THE INVENTION

1. Field of the Invention

The invention relates generally to lithography methods for producing semiconductor devices.

2. Background of the Related Art

In the semiconductor field, there has been and continues to be a trend toward smaller devices and higher device densities. This trend shows no signs of abating in the future. Higher densities require the reducing of device sizes and/or distance between devices on semiconductor wafers. In addition, the overall size and/or spacing of interconnects between devices may also need to be reduced.

The trend towards higher device densities leads to a requirement for increased resolution in lithographic processes, such as photolithographic processes. Generally speaking, lithography involves any of a variety of processes for transferring patterns between various types of media. With particular regard to semiconductor fabrication processes, silicon or other semiconductor material may be coated with a resist material that is sensitive to a particular type of light or radiation. Such coating may be done, for example, by spin coating of the resist material onto the semiconductor wafer. After suitable preparation, a radiation source, such as a light source or source for other types of suitable radiation, may be used to expose selected areas of the resist to radiation. The exposure pattern may be transferred through an intervening mask or reticle, such that the pattern on the mask or reticle is transferred to the resist, either positively or negatively. Exposure to light or other radiation selectively changes the properties of the resist layer during the exposure process. This change in properties can be utilized to selectively expose portions of the underlying semiconductor substrate. For example, exposure may change the solubility of portions of the photoresist to a given solvent. The solvent may then be used to wash away either the exposed or unexposed portions of the photoresist (depending on the type of solvent and the change in solubility caused by exposure to suitable radiation). Thus, the pattern of the mask or reticle may be duplicated, either positively or negatively, in the resist on top of the semiconductor substrate. Suitable operations may be then carried out on the exposed portions of the substrate, such as doping or etching operations.

A prior-art pass-through lithographic system 80 schematically is illustrated in FIG. 1. The system 80 includes a light source 82, and a pass-though mask 84 for selectively passing light 86 to a target 88, which may for example be a resist-coated semiconductor device. The pattern from the mask 84 is thus transferred to the target 88. It will be appreciated that the system 80 may include additional elements.

The system 80 allows the light 86 to proceed in a direct line from the light source 82 to the target 88, with the light 86 passing through the mask 84 substantially normally incident to the mask 84.

However, with decreasing feature sizes, resolution requirements have increased to the point that optical systems may no longer be able to achieve the required resolution, due to limits inherently related to the wavelengths of optical light employed in such systems. One possibility of increasing resolution beyond the limits inherent to optical photolithography systems is to utilize shorter-wave length radiation. One specific possibility has been the use of extreme ultraviolet (EUV) radiation, having wavelengths in the range of about 30 to 700 Angstroms (3–70 nm). Use of EUV radiation allows the possibility of achieving better resolution than in optical photolithography systems. A schematic diagram of a typical EUV lithography system is shown in FIG. 2. The system 100 shown in FIG. 2 generates an image onto a target 102, such as a semiconductor substrate coated with an appropriate resist, from a reflective mask or reticle 104. The transferred pattern may involve a pattern for fabrication directly onto the semiconductor substrate, such as by doping or etching. Alternatively, the pattern may involve other semiconductor fabrication operations, such as fabrication of interconnects on a suitable pattern, for example, to suitably connect together semiconductor devices on the substrate.

A radiation source 108, for example, being a partially-coherent laser source, generates suitable EUV radiation 109, for example, having a wavelength of about 3 nm to about 70 nm. A condenser 110 may aid in directing the EUV radiation in a desired direction. Optical filtering elements 112, such as lenses or other elements, may also be used in creating a beam of radiation of a suitable size, with a suitable intensity. One or more beams 114 of EUV radiation then impinge upon the reticle 104. The reticle 104 reflects portions of the beams 114, corresponding to the reflective pattern on the reticle 104. The reflective light corresponds to the desired pattern to be exposed on the resist of the target 102. The reflected portion 116 of the beams 114 may then pass through other optical elements, such as mirrors 118, eventually being directed to the target 102.

One difference between the system 100 shown in FIG. 2, and optical systems, is that prior optical systems have generally utilized a mask that selectively allows light to pass through, as shown in FIG. 1, rather than employing a reflective reticle, such as the reticle 104.

It will be appreciated that the system 100 shown in FIG. 2 is merely a schematic, showing some of the components of a reflective system for patterning using EUV radiation. Other suitable components, such as lenses, slits, or the like, may be utilized in such systems. The system 100 shown in FIG. 2 may be able to achieve a feature resolution better than that which may be had from optical photolithography systems. For example, the system 100 may achieve a feature resolution of 0.035 $\mu$m (microns).

Although the general parameters of a reflective system for achieving high-resolution lithography have been set out, it will be appreciated that improvements are desirable in the design of a reflective mask, for example, in order to improve resolution and/or avoid unwanted effects in lithography.

SUMMARY OF THE INVENTION

According to an aspect of the invention, a lithography system includes a configurable multi-faceted mirror.

According to another aspect of the invention, a lithography method includes re-configuring a multi-faceted mirror.

According to yet another aspect of the invention, a lithography method for selectively exposing first and second (different) targets, includes: performing a first patterning of a first target; re-configuring the reflective condenser to a second configuration; and performing a second pattering of a second target. The performing the first patterning includes: directing light from a light source through a re-configurable reflective condenser in a first configuration to a first reflective reticle; and reflecting the light from the first reflective reticle to a first target to be selectively exposed. The second patterning includes: directing light from a light source through the re-configurable reflective condenser in a second configuration to a second reflective reticle; and reflecting the light from the second reflective reticle to a second target to be selectively exposed.

According to still another aspect of the invention, a method of lithography include re-configuring, between lithography operations, reflective facets of a multi-faceted mirror that is part of a reflective condenser, wherein the re-configuring results in altering of light characteristics of light exiting the reflective condenser to strike a reflective reticle.

According to a further aspect of the invention, a lithography system includes: a light source; a reflective reticle; and a re-configurable reflective condenser that directs light from the light source to the reflective reticle. The reflective condenser includes a re-configurable multi-faceted mirror.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, which are not necessarily to scale.

DETAILED DESCRIPTION

A method of reflective lithography includes placing an adjustable (configurable) multi-faceted mirror in a condenser that collects and redirects light from a source to a reticle, an imaging system, and finally a target to be patterned. The adjustable multi-faceted mirror has a plurality of separately adjustable mirror elements or facets. The orientation of the mirror elements may be adjusted to adjust the characteristics of the light reaching a reflective reticle in order to achieve certain imaging characteristics at the resist layer that is being exposed. For example, coherence, shape of the illumination at the pupil of the imaging system, and/or configuration of the light output may be changed. The method and a corresponding system may be employed in extreme ultraviolet light (EUVL) lithography.

Figure 1:
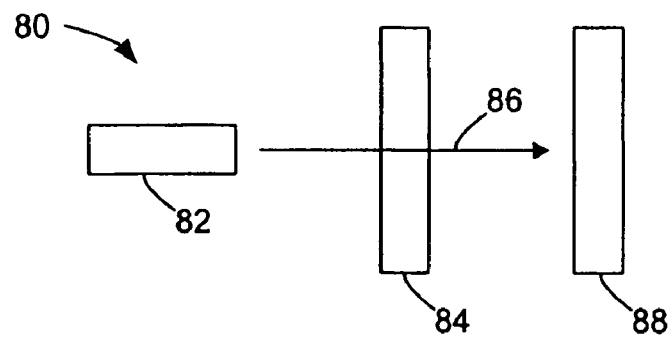
FIG. 1 is a schematic diagram of a prior art pass-through lithography system.
Figure 2:
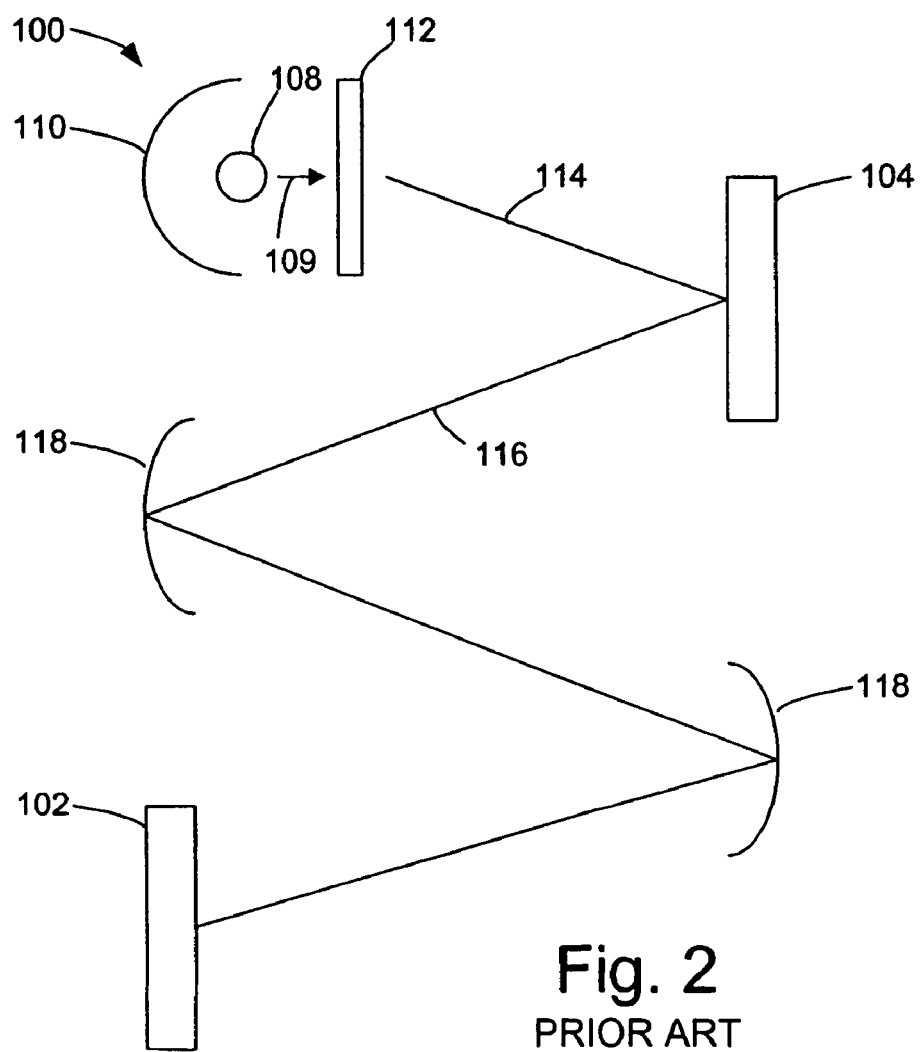
FIG. 2 is a schematic diagram of a prior art reflective lithography system.
Figure 3:
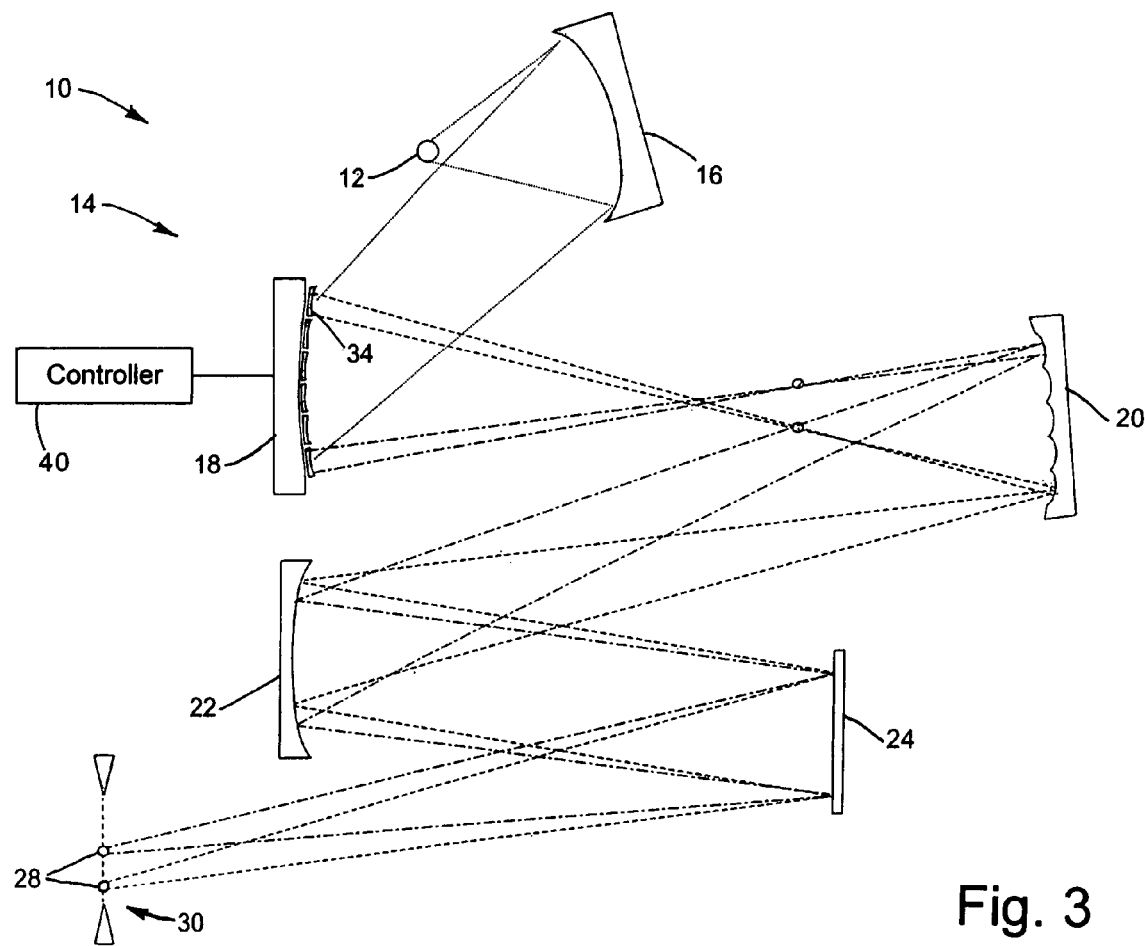
FIG. 3 is a schematic diagram of a lithography system in accordance with the present invention.

FIG. 3 shows a portion of a lithography system 10. The lithography system 10 includes a light (radiation) source 12. The light from the light source 12 is directed by a condenser 14, including a collector 16, a first adjustable faceted mirror 18, a second faceted mirror 20, and a third mirror 22, onto a patterned reflective reticle or reflective reticle 24. The reflective reticle 24 has a pattern thereupon to be transferred to a target. For example, the target may be a resist layer or resist-coated portion of a wafer or a portion of a wafer. An imaging system with a pupil 30 is used to form the image of the reticle onto the target. The light directed by the condenser 14 produces a light distribution 28 at the pupil 30 of the imaging system in such a way as to produce the right imaging characteristics at the target.

It will be understood that the terms "reticle" and "target," as used herein, include not only a whole reticle or target, but also a portion of a reticle or target.

The multi-faceted mirror 18 is a fly's eye mirror that includes a plurality of adjustable facets or elements 34. Each of the facets 34 reflects and re-directs a portion of incoming light to a new direction. By adjusting each of the individual facets 34, the characteristics of the light (radiation) received at the reticle 24 and at the pupil 30 may be changed. For example the shape or coherence of the light may be altered by suitably setting the positions of the facets 34 of the multi-faceted mirror 18. The degree of partial coherence (which is related to the distribution of light intensity at the pupil 30) may be increased or decreased using the multi-faceted mirror 18. The shape of the light distribution at pupil 30 may also be altered by suitably configuring the facets 34 of the multi-faceted mirror 18, for example changing a circular cross-section light spot to an elliptical cross-section light spot, or changing a circular light spot to an annular light spot.

A controller 40 may be operatively coupled to the multi-faceted mirror 18 to control the orientation of the facets 34, to produce a desired effect on the radiation from the light source 12 that reaches the reticle 24, the pupil 30, and the target. The controller 40 may control the positioning of the facets 34 of the multi-faceted mirror 18 to produce different illumination effects of the light distribution at the pupil 30 for different types of reticle 24. For example, different types of features on the reticle 24 may be optimally reproduced on the target with different illumination characteristics, such as different degrees of partial coherence and/or distributions of light 28 at the pupil 30. For instance, the imaging of very fine lines and spaces oriented in one particular orientation may be best achieved by adjusting the illumination distribution at the pupil 30 to form two small spots at opposing ends of the pupil diameter, a type of illumination termed dipole.

As another alternative, the controller 40 may reposition the facets 34 between fabrication steps, when a new reticle 24 and/or target is used. The system 10 may thus be re-configurable for different types of fabrication operations, for example for fabricating different types of devices having different types of structures.

The controller 40 may include one or more suitable microprocessors for sending suitable control signals to the multi-faceted mirror 18, and/or to motors or other positioning devices controlling the position of the reticle 24 and/or the target. The controller 40 may be coupled to other suitable devices, such as data storage devices and input devices, for entering and storing data regarding the desired controlling operations.

It will be appreciated that the portion of the system 10 shown in FIG. 3 is a schematic representation showing representations of some components of an actual lithographic system. The system may also have other components, such as additional reflectors that are part of the condenser 14, and/or are between the reticle 24 and the target.

Figures 4, 5:
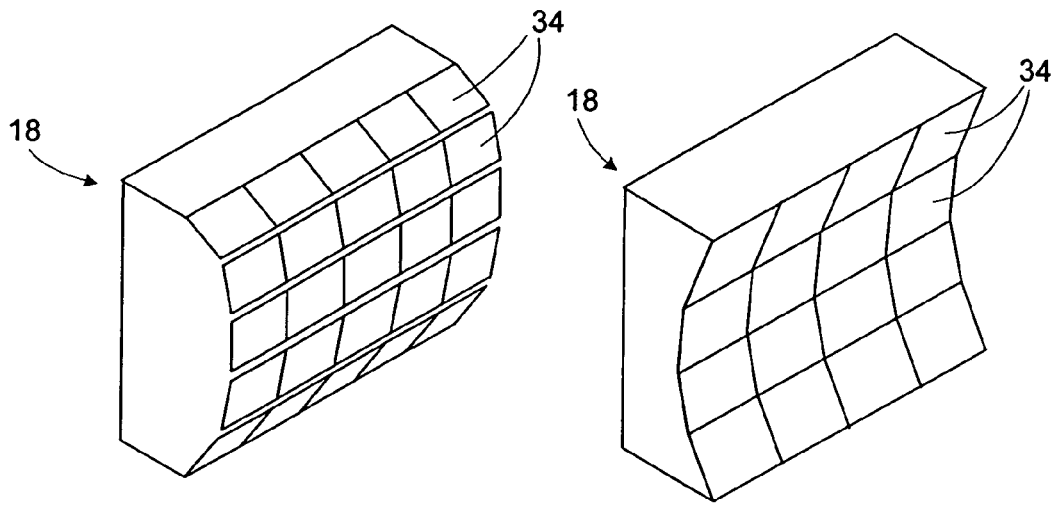
FIG. 4 is an oblique view showing one possible configuration of the multi-faceted mirror of the system of FIG. 3.
FIG. 5 is an oblique view showing another possible configuration of the multi-faceted mirror of the system of FIG. 3.

FIGS. 4 and 5 show possible configurations of the facets 34 of the multi-faceted mirror 18. As shown in FIG. 4, the multi-faceted mirror 18 may have a convex shape. Alternatively, as shown in FIG. 5, the multi-faceted mirror 18 may have a concave shape. The facets 34 themselves may have flat or curved surfaces. The multi-faceted mirror may be formed of an array containing maybe 25 or more facets.

Figures 6, 7:
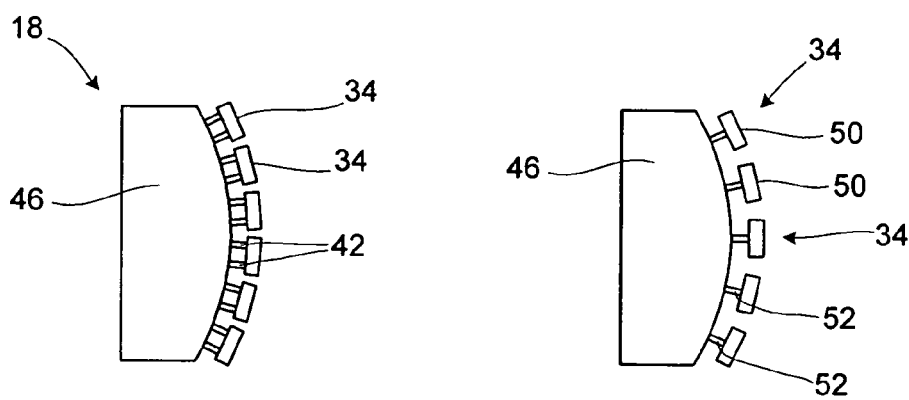
FIG. 6 is a cross-sectional view of the multi-faceted mirror of FIG. 4, showing one type of structure for orienting the facets.
FIG. 7 is a cross-sectional view of the multi-faceted mirror of FIG. 4, showing another type of structure for orienting the facets.

With reference now to FIG. 6, each of the facets 34 may have its orientation controlled by a number of piezoelectric pushers 42, which may be separately actuated to tilt the individual facets 34 relative to a base 46 of the multi-faceted mirror 18. The pushers 42 may be slabs or pillars of suitable piezoelectric material between pairs of electrode for providing a voltage difference across the piezoelectric material. Exemplary piezoelectric materials include quartz, rochelle salt, tourmaline, ammonium dihydrogen phosphate, and ephylenediamine tartrate. Exemplary techniques for depositing the piezoelectric material include chemical vapor deposition, sputtering, and physical vapor deposition through evaporation.

In an alternative configuration for the multi-faceted mirror 18, illustrated in FIG. 7, the facets 34 may each include a tilted micro-mirror 50 tiltable about its axis by a micro-machined actuator 52. The facets 34 with the micro-mirrors 50 may function similarly to the other types of facets 34 described above, allowing portions of incoming light to be directed at slightly different angles, to the degree of partial coherence for imaging. The micro-mirrors 50 may be a few millimeters in diameter, although it will be appreciated that a variety of other suitable sizes may be used.

Figure 8:
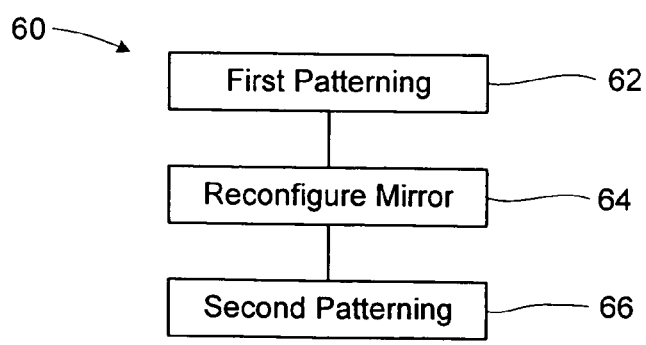
FIG. 8 is high level flow chart of a lithography method in accordance with the present invention.

Turning now to FIG. 8, in a lithography method 60 of using the system 10, a first patterning of a first target is performed in step 62, in which the adjustable multi-faceted mirror 18 is adjusted to a first configuration. Then, in step 64, the multi-faceted mirror 18 is re-configured to a second configuration, by suitable movement of the facets 34. Finally in step 66, a second patterning of a second target is performed. The first and second patternings may involve different portions of a reflective reticle, or may involve different reflective reticles. The first and second patternings may involve different portions of a wafer as the first and second targets, or may involve different wafers as the two targets. The two patternings may involved differences in light (radiation) characteristics, such as differences in degrees of partial coherence or light spot pupil fill (e.g., fully filled versus annular light spots of various extents).

Figure 9:
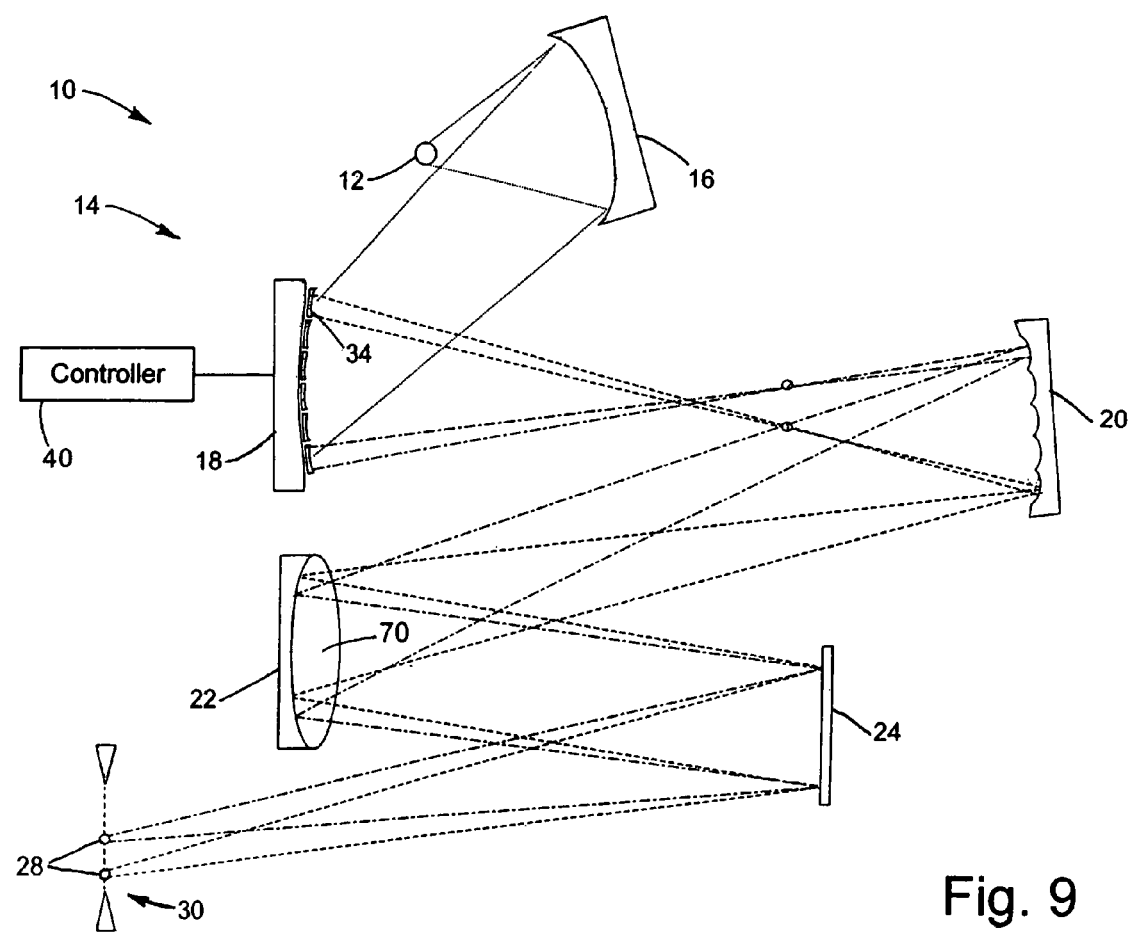
FIG. 9 is a schematic diagram of an alternate embodiment lithography system in accordance with the present invention.

In addition to fully reflective lithography systems, the adaptive condenser 14 may be used in catadioptric systems, such as the system 10' illustrated in FIG. 9, which includes optics 70 inside the condenser, between the source 12 and the reticle 24. The optics 70 may include suitable lenses, filters, apertures, or other devices.

The lithography systems and methods described herein may provide greater flexibility and ranges of available light characteristics when compared with prior systems. The systems and methods may be suitable for use for extreme ultraviolet light (EUVL) lithography.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A lithography method for selectively exposing parts of first and second targets, comprising:
    performing a first patterning of a first target, wherein the first patterning includes:
        directing light from a light source through a re-configurable reflective condenser in a first configuration to a first reflective reticle portion; and
        reflecting the light from the first reflective reticle portion to a first target portion to be selectively exposed;
    after performing the first patterning, re-configuring the reflective condenser to a second configuration, wherein the re-configuring results in altering of light characteristics of light exiting the reflective condenser; and
    after the re-configuring, performing a second patterning of a second target, wherein the second patterning includes:
        directing light from a light source through the re-configurable reflective condenser in the second configuration to a second reflective reticle portion; and
        reflecting the light from the second reflective reticle portion to a second target portion to be selectively exposed.

2. The method of claim 1, wherein the re-configuring includes configuring reflective facets of a multi-faceted mirror that is part of the reflective condenser.

3. The method of claim 2, wherein the configuring the facets includes selectively actuating piezoelectric pushers of the multi-faceted mirror, wherein each of the reflective facets has multiple of the piezoelectric pushers coupled thereto.

4. The method of claim 2, wherein the configuring the facets includes using a controller that is coupled to the mirror to control the re-configuring the reflective facets.

5. The method of claim 4, wherein the controller is also operatively coupled to the reflective reticle portions.

6. The method of claim 1, wherein the re-configuring from the first configuration of the reflective condenser to the second configuration of the reflective condenser results in a change of a degree of partial coherence of the light output from the reflective condenser.

7. The method of claim 1, wherein the re-configuring from the first configuration of the reflective condenser to the second configuration of the reflective condenser results in a change of a light distribution at the pupil.

8. The method of claim 1, wherein the light produced by the light source is extreme ultraviolet (EUV) radiation, having a wavelength in the range of about 30 to 700 Angstroms (3–70 nm).

9. The method of claim 1, wherein the first patterning and the second patterning includes passing the light through optics between the reticle portions and the targets.

10. The method of claim 1, wherein the reflective reticle portions are different portions of a single reflective reticle.

11. The method of claim 1, wherein the reflective reticle portions are portions of different reflective reticles.

12. The method of claim 1, wherein the target portions are wafer portions covered with resist.

13. The method of claim 12, wherein the wafer portions are portions of a single wafer.

14. The method of claim 12, wherein the wafer portions are portions of different wafers.

15. A method of lithography comprising:
re-configuring, between lithography operations, reflective facets of a multi-faceted mirror that is part of a reflective condenser, wherein the re-configuring results in altering of light characteristics of light exiting the reflective condenser to strike a reflective reticle.

16. The method of claim 15, wherein the re-configuring results in changing a degree of partial coherence of the light.

17. The method of claim 15, wherein the reconfiguring results in changing a distribution of light at the pupil of the imaging system.

18. The method of claim 15, further comprising performing one of the lithography operations prior to the re-configuring, and performing another of the lithography operations after the configuring.

19. The method of claim 18, wherein both of the lithography operations involve selective exposure of different parts of a single wafer.

20. The method of claim 19, wherein the lithography operations involve reproductions of different types of features.

* * * * *

UNITED STATES PATENT AND TRADEMARK OFFICE
CERTIFICATE OF CORRECTION

| | |
|---|---|
| PATENT NO. | : 6,977,718 B1 |
| APPLICATION NO. | : 10/791263 |
| DATED | : December 20, 2005 |
| INVENTOR(S) | : Bruno M. LaFontaine |

It is certified that error appears in the above-identified patent and that said Letters Patent is hereby corrected as shown below:

Column 2,
Line 60, replace "second pattering of" with -- second patterning of --.

Signed and Sealed this

Twentieth Day of June, 2006

JON W. DUDAS
*Director of the United States Patent and Trademark Office*